Figure 1:
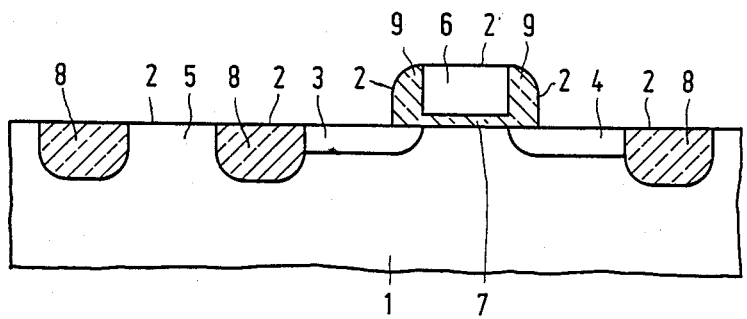

United States Patent [19]

Raaijmakers

[11] Patent Number: 4,908,331

[45] Date of Patent: Mar. 13, 1990

[54] METHOD OF MANUFACTURING A SEMICONDUCTOR DEVICE BY DEPOSITING METAL ON SEMICONDUCTOR MAINTAINED AT TEMPERATURE TO FORM SILICIDE

[75] Inventor: Ivo J. M. M. Raaijmakers, San Jose, Calif.

[73] Assignee: U.S. Philips Corporation, New York, N.Y.

[21] Appl. No.: 369,443

[22] Filed: Jun. 21, 1989

[30] Foreign Application Priority Data

Jun. 27, 1988 [NL] Netherlands ............... 8801632

[51] Int. Cl.$^4$ .................. H01L 21/285; H01L 29/54; H01L 29/62
[52] U.S. Cl. ...................................... 437/187; 437/200
[58] Field of Search ..................... 437/187, 200; 148/DIG. 147

[56] References Cited

U.S. PATENT DOCUMENTS

| | | | |
|---|---|---|---|
| 4,378,628 | 4/1983 | Levinstein et al. | 437/196 |
| 4,526,665 | 7/1985 | Tanielian et al. | 204/192.15 |
| 4,814,294 | 3/1989 | West et al. | 437/200 |

OTHER PUBLICATIONS

Gross et al., J. Vac. Sci. Techol., B, 6(5), pp. 1548-1552.
West et al., Appl. Phys. Lett., 53(9)., pp. 740-742.
Gross et al., Proc. Electrochem. Soc., 87-88 (Proc. Int. Conf. Chem. Vapor Deposition, 10th, 1987), pp. 759-765.
Murarka et al., J. Appl. Phys., vol. 56, No. 12 (Dec. 1984), pp. 3404-3412.

*Primary Examiner*—Olik Chaudhuri
*Attorney, Agent, or Firm*—Paul R. Miller

[57] ABSTRACT

A method of manufacturing a semiconductor device comprises a semiconductor body (1) having a surface (2), which is adjoined by regions of silicon (3, 4, 5 and 6) and regions of insulating material (8 and 9), the regions of silicon being provided with a top layer (10) of a metal silicide by depositing metal on the surface while heating the semiconductor body to a temperature at which metal silicide is formed during the deposition. According to the invention, cobalt or nickel is deposited while the semiconductor body is heated to a temperature at which cobalt or nickel silicide is formed. Thus, metal silicide does not grow over parts of the regions of insulating material adjoining directly the regions of silicon.

7 Claims, 1 Drawing Sheet

METHOD OF MANUFACTURING A SEMICONDUCTOR DEVICE BY DEPOSITING METAL ON SEMICONDUCTOR MAINTAINED AT TEMPERATURE TO FORM SILICIDE

The invention relates to a method of manufacturing a semiconductor device comprising a semiconductor body having a surface adjoined by regions of silicon and regions of insulating material, the regions of silicon being provided with a top layer of a metal silicide by depositing metal on the surface and by then heating the semiconductor body to a temperature at which during the deposition the metal silicide is formed by reaction of the metal with the silicon.

The regions of silicon may be both regions of monocrystalline silicon and regions of polycrystalline silicon. In the first case, they constitute, for example, semiconductor zones of transistors, such as source and drain zones of field effect transistors; in the second case, they constitute, for example, conductor tracks, such as gate electrodes of field effect transistors. Both kinds of regions of silicon may of course also form past of bipolar transistors and of other semiconductor circuit elements. The regions of insulating material may mutually insulate as field oxide regions circuit elements provided in the semiconductor body. They may also constitute, for example, an insulation between gate electrodes and source and drain zones of field effect transistors. They may be made of different materials, such as silicon oxide, silicon nitride, silicon oxynitride, but also, for example, of aluminum oxide.

By providing the silicon regions with a top layer of a metal silicide, it is achieved inter alia that monocrystalline semiconductor zones can be more readily contacted and that polycrystalline conductor tracks obtain a lower electrical resistance. The regions are provided in the manner described above in a self-registered manner with a top layer of a metal silicide. During the deposition, the metal reacts with silicon, but it will not react with the insulating material. After deposition, the metal can be simply etched away from the regions of insulating material, while the metal silicide is left behind as a top layer on the silicon regions.

U.S. Pat. No. 4,526,665 discloses a method of the kind mentioned in the opening paragraph, in which as metal titanium, tantalum, molybdenum, niobium or tungsten is deposited on the surface. The semiconductor body is then heated to a temperature lying between 450° C. and 650° C.

A disadvantage of the known method is that during the metal deposition a silicide is formed not only on the regions of silicon, but also on parts of the regions of insulating material directly adjoining the regions of silicon. Such a growth of metal silicide over parts of insulating material can give rise to short-circuits, especially if the regions of insulating material have very small dimensions of, for example, less than 1 μm.

The invention has inter alia for its object to provide a method, which permits providing the silicon regions with a top layer of a metal silicide, the overgrowth of metal silicide on the regions of insulating material being practically avoided.

For this purpose, according to the invention, the method mentioned in the opening paragraph is characterized in that, as a metal cobalt or nickel, is deposited on the surface, while the semiconductor body is then heated to a temperature at which cobalt or nickel disilicide is formed.

The invention is based on the recognition of the fact that growth of metal silicide over parts of the regions of insulating material directly adjoining the silicon regions using one of the metals titanium, tantalum, molybdenum, niobium or tungsten (as are used in the known method described) is due to two causes. A first cause resides in the fact that the metal silicide of the metals has a larger molar volume than that of silicon. The metal silicide effectively grows from the regions of silicon and then over the regions of insulating material. A second cause resides in the fact that during the formation of the metal silicide silicon atoms diffuse more rapidly through the metal silicide than the atoms of the metals. This means that during the growth of the top layer of metal silicide silicon atoms diffuse through the metal silicide and then react with metal atoms. Since such a diffusion occurs especially in a lateral direction, i.e. in the direction of the regions of insulating material, metal silicide can be formed also on these regions.

According to the invention cobalt or nickel disilicide is formed. These disilicides have a molar volume which is smaller than that of silicon. As a result, the metal silicide effectively grows into the regions of silicon. Moreover, the semiconductor body is heated during the metal deposition to a temperature at which cobalt or nickel disilicide is directly formed. In this case, silicon atoms diffuse even more slowly during the growth of the metal silicide through metal silicide than the metal atoms. This also results in that it is counteracted that metal silicide is formed on the regions of insulating material.

It should be noted that during the formation of cobalt or nickel monosilicide silicon atoms diffuse more rapidly through the metal silicide than the metal atoms. This form of metal silicide is not obtained, however, if during the deposition the temperature of the semiconductor body is sufficiently high. In this case, disilicide is formed directly. Cobalt disilicide is formed directly if the temperature of the semiconductor body is higher during the metal deposition than 500° C. While nickel disilicide is formed directly if this temperature is higher than 750° C.

Since cobalt disilicide has a considerably lower resistivity than nickel disilicide, metal cobalt is preferably deposited on the surface of the semiconductor body.

Preferably, the semiconductor body is heated during the deposition of cobalt to a temperature which lies between 500° C. and 800° C. Below 500° C., there is a risk that instead of disilicide monosilicide is formed. Above 800° C. there is a risk that in the presence of cobalt the regions of insulating material change in structure in such a manner that, after cobalt has been etched away, an insulating layer having a rough surface is left. If cobalt is deposited at too high a deposition rate, the undesired monosilicide is formed. If cobalt is deposited at a suitable deposition rate, this is not the case. If the semiconductor body is heated to a temperature of 580° C., no monosilicide is formed if cobalt is deposited at a rate of about 1 nm/sec; if the temperature is 620° C. at a deposition rate of about 5 nm/sec and if the temperature is 650° C. at a deposition rate of about 10 nm/sec, this is not the case either. Preferably, the semiconductor body is heated to a temperature lying in this temperature range because a practical deposition rate can then be chosen. In practice a layer of cobalt disilicide of about 60 nm is necessary (the electrical resistance is then about 3 Ohms per square), for which about 20 nm of cobalt must be deposited. This can then take place within about 2 to 20 seconds.

Figure 2:
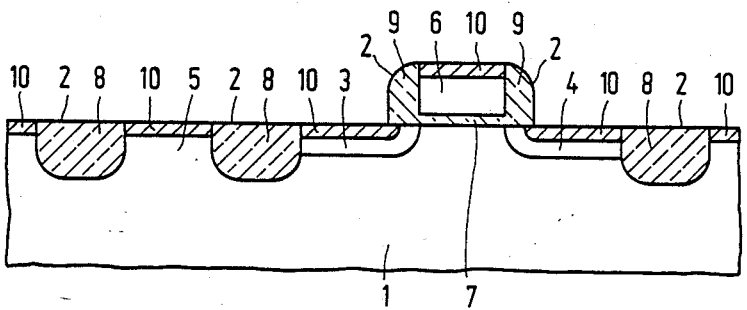

The invention will now be described more fully with reference to a drawing. In the drawing:

FIGS. 1 and 2 show two stages of manufacture of a semiconductor device, which is obtained by means of the method according to the invention.

The semiconductor device comprises a semiconductor body 1 having a surface 2, which is adjoined by regions of silicon 3, 4, 5 and 6 and regions of an insulating material 8 and 9. The regions of silicon 3, 4 and 5 consists of monocrystalline silicon. The regions 3 and 4 constitute in this embodiment the source and drain zones of a field effect transistor. Via the region 5, for example, the semiconductor body 1 may be contacted. The region of silicon 6 consists of polycrystalline silicon and constitutes the gate electrode of the field effect transistor, which is insulated by a layer of gate oxide 7 from the part of the semiconductor body 1 located between the source zone and the drain zone 3 and 4, respectively. The regions of insulating material 8 and 9 in this embodiment consists of silicon oxide, but they may also consists of silicon nitride, silicon oxynitride or even of aluminium oxide. The insulating regions 8 insulate as field oxide regions the source and drain zones 3, 4 from the region 5. The insulating regions 9 insulate the gate electrode 6 in lateral direction from the source and drain zones 3 and 4.

The regions of silicon 3, 4, 5 and 6 are provided with a top layer 10 of a metal silicide by depositing metal on the surface 2 and by then heating the semiconductor body 1 to a temperature at which the metal silicide 10 is formed during the deposition by reaction of the metal with the silicon 3, 4, 5 and 6. The monocrystalline silicon regions 3, 4 and 5 can thus be contacted more satisfactorily and the polycrystalline silicon region 6 thus has a lower electrical resistance.

The silicon regions 3, 4, 5 and 6 are provided in a self-registered manner with the top layer 10. During the deposition, the metal reacts with silicon, but this will not be the case with the insulating material of the regions 8 and 9. After the top layer 10 has been formed, the metal which has been deposited on the insulating regions 8 and 9 can be simply etched away in a usual manner selectively with respect to the metal silicide formed.

According to the invention, metal cobalt or nickel is deposited on the surface 2, while the semiconductor body 1 is then heated to a temperature at which cobalt or nickel disilicide is formed. Due to the measure according to the invention, the formation of metal silicide on parts of the regions of insulating material 8 and 9, which immediately adjoin the regions of silicon 3, 4, 5 and 6, is practically avoided. Since both cobalt and nickel disilicide have a molar volume (of $38.6 \times 10^{-3}$ nm$^3$ and $39.3 \times 10^{-3}$ nm$^3$, respectively) which is smaller than that of two silicon atoms (of $40.0 \times 10^{-3}$ nm$^3$), the metal silicide effectively grows into the regions of silicon 3, 4, 5 and 6. Moreover, the semiconductor body 1 is heated during the metal deposition to a temperature at which cobalt or nickel disilicide is formed. During the growth of the metal silicide, silicon atoms diffuse more slowly than metal atoms through metal silicide. The growth of the metal silicide therefore takes place mainly near the transition between silicon and metal silicide. Also as a result thereof, the formation of metal silicide on the regions of insulating material 8 and 9 is counteracted. In practice, it has been found that no cobalt or nickel disilicide is formed on the regions of insulating material 8 and 9.

Cobalt and nickel may be deposited in a usual manner, for example by means of magnetron sputtering or evaporation, on a semiconductor body. In the second case, the metal is then preferably heated by means of an electron beam.

Preferably, the semiconductor body 1 is heated during the deposition of cobalt to a temperature lying between 500° C. and 800° C. Below 500° C., monosilicide is formed, while above 800° C. there is a risk that in the presence of cobalt the regions of insulating material 8, 9 degrade to such an extent that, after cobalt has been etched away, an insulating layer having a rough surface is left. During the deposition of nickel, for the same reasons the semiconductor body is preferably heated to a temperature lying between 750° C. and 900° C.

During the growth of cobalt and nickel disilicide, diffusion of metal atoms through silicide already formed plays an important part. If the metal atoms are deposited at too high a rate, the undesired monosilicide is formed. Through monosilicide, silicon atoms diffuse more rapidly than metal atoms so that there is a risk that overgrowth of silicide on insulating material occurs. This risk does not exist if before the formation of cobalt disilicide the semiconductor body is heated to a temperature of 580° C., 620° C. and 660° C. and if cobalt is then deposited at a rate of 1 nm/sec, 5 nm/sec and 10 nm/sec, respectively. These rates are practical deposition rates at which a layer of cobalt of about 20 nm can be deposited in 2 to 20 seconds. A layer of cobalt disilicide of about 60 nm is then formed having a resistance of about 3 Ohms per square. A layer of nickel disilicide must be about 3 times thicker in order to obtain the same low resistance. In order that such a layer can also be deposited in 2 to 20 seconds without the likewise undesired nickel monosilicide being formed, the semiconductor body must then be heated to a temperature which lies between 800° C. and 880° C. At 800° C., nickel can then be deposited at a deposition rate of about 2 nm/sec, at 840° C. at a rate of about 10 nm/sec, at 880° C. at a rate of about 20 nm/sec.

Preferably, as metal cobalt is deposited on the semiconductor surface because cobalt disilicide has a lower resistivity than nickel disilicide (18 and 50 μΩ-cm, respectively) so that, in order to obtain a layer of metal silicide having a desired resistance per square, the quantity of cobalt to be deposited is smaller than that of nickel.

If the surface 2 is thoroughly cleaned before the metal deposition, preferably by carrying out a usual sputter etching treatment, after which cobalt or nickel is deposited in the same apparatus directly without exposing the surface to air, the layer grows epitaxially and a monocrystalline layer of disilicide is formed on the monocrystalline silicon regions 3, 4 and 5. Such a monocrystalline layer of disilicide may be used, for example, for manufacturing a socalled metal-base transistor.

I claim:

1. A method of manufacturing a semiconductor device comprising a semiconductor body having a surface which is adjoined by regions of silicon and regions of insulating material, the regions of silicon being provided with a top layer of a metal silicide by depositing metal on the surface and heating the semiconductor body to a temperature at which the metal silicide is formed during the deposition by reaction of the metal with the silicon, characterized in that a metal cobalt or nickel is deposited on the surface, while maintaining the semiconductor body at a temperature at which cobalt or nickel disilicide is formed.

2. A method as claimed in claim 1, characterized in that said metal is cobalt.

3. A method as claimed in claim 2, characterized in that the semiconductor body is heated during the deposition of cobalt to a temperature which lies between 500° C. and 800° C.

4. A method as claimed in claim 3, characterized in that the semiconductor body is heated during the deposition of cobalt to a temperature which lies between 580° C. and 660° C.

5. A method as claimed in claim 1, characterized in that the semiconductor body is heated during the deposition of nickel to a temperature which lies between 750° C. and 900° C.

6. A method as claimed in claim 5, characterized in that the semiconductor body is heated during the deposition of nickel to a temperature which lies between 800° C. and 880° C.

7. A method as claimed in claim 1, characterized in that the surface is cleaned before the metal deposition by carrying out a sputter etching treatment, and in that then the metal deposition is carried out directly without exposing the surface to air.

* * * * *